(12) United States Patent
Plug et al.

(10) Patent No.: US 7,586,598 B2
(45) Date of Patent: *Sep. 8, 2009

(54) METROLOGY TOOL, SYSTEM COMPRISING A LITHOGRAPHIC APPARATUS AND A METROLOGY TOOL, AND A METHOD FOR DETERMINING A PARAMETER OF A SUBSTRATE

(75) Inventors: Reinder Teun Plug, Eindhoven (NL); Arie Jeffrey Den Boef, Waalre (NL); Karel Diederick Van Der Mast, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 127 days.

This patent is subject to a terminal disclaimer.

(21) Appl. No.: 11/802,257

(22) Filed: May 21, 2007

(65) Prior Publication Data

US 2007/0279742 A1    Dec. 6, 2007

Related U.S. Application Data

(63) Continuation-in-part of application No. 11/443,452, filed on May 31, 2006.

(51) Int. Cl.
*G01N 21/00* (2006.01)
(52) U.S. Cl. ............... 356/237.2; 356/603; 356/622; 355/53; 318/611; 430/5
(58) Field of Classification Search ............ None
See application file for complete search history.

(56) References Cited

U.S. PATENT DOCUMENTS

| 5,703,692 A | 12/1997 | McNeil et al. ........... 356/445 |
| 5,880,838 A | 3/1999 | Marx et al. ............ 356/351 |
| 5,959,427 A | 9/1999 | Watson |
| 5,963,329 A | 10/1999 | Conrad et al. .......... 356/372 |
| 6,417,914 B1 | 7/2002 | Li |
| 6,608,690 B2 | 8/2003 | Niu et al. ............. 356/635 |

(Continued)

FOREIGN PATENT DOCUMENTS

EP    1 197 801 A1    4/2002

(Continued)

OTHER PUBLICATIONS

European Search Report for Appln. No. EP 07 07 5411 mailed Sep. 20, 2007, 3 pgs.

*Primary Examiner*—Gregory J Toatley, Jr.
*Assistant Examiner*—Juan D Valentin
(74) *Attorney, Agent, or Firm*—Sterne, Kessler, Goldstein & Fox P.L.L.C.

(57) ABSTRACT

A metrology tool is arranged to measure a parameter of a substrate that has been provided with a pattern in a lithographic apparatus. The metrology tool includes a base frame, a substrate table constructed and arranged to hold the substrate, a sensor constructed and arranged to measure a parameter of the substrate, a displacement system configured to displace the substrate table or the sensor with respect to the other in a first direction, a balance mass, and a bearing configured to movably support the first balance mass so as to be substantially free to translate in a direction opposite of the first direction in order to counteract a displacement of the substrate table or sensor in the first direction.

26 Claims, 7 Drawing Sheets

U.S. PATENT DOCUMENTS

| | | | |
|---|---|---|---|
| 6,699,624 B2 | 3/2004 | Niu et al. | 430/5 |
| 6,704,661 B1 | 3/2004 | Opsal et al. | 702/27 |
| 6,721,691 B2 | 4/2004 | Bao et al. | 702/189 |
| 6,738,138 B2 | 5/2004 | Wei | 356/369 |
| 6,753,961 B1 | 6/2004 | Norton et al. | 356/364 |
| 6,768,983 B1 | 7/2004 | Jakatdar et al. | 706/46 |
| 6,772,084 B2 | 8/2004 | Bischoff et al. | 702/127 |
| 6,785,638 B2 | 8/2004 | Niu et al. | 702/189 |
| 6,813,034 B2 | 11/2004 | Rosencwaig et al. | 356/601 |
| 6,819,426 B2 | 11/2004 | Sezginer et al. | 356/401 |
| 6,856,408 B2 | 2/2005 | Raymond | 356/601 |
| 6,906,786 B2 * | 6/2005 | Cox et al. | 355/53 |
| 6,919,964 B2 | 7/2005 | Chu | 356/401 |
| 6,928,628 B2 | 8/2005 | Seligson et al. | 716/4 |
| 6,972,852 B2 | 12/2005 | Opsal et al. | 356/625 |
| 6,974,962 B2 | 12/2005 | Brill et al. | 250/548 |
| 6,987,572 B2 | 1/2006 | Lakkapragada et al. | 356/601 |
| 7,042,552 B1 | 5/2006 | Werkman et al. | 355/55 |
| 7,046,376 B2 | 5/2006 | Sezginer | 356/601 |
| 7,061,615 B1 | 6/2006 | Lowe-Webb | 356/401 |
| 7,061,623 B2 | 6/2006 | Davidson | 356/497 |
| 7,061,627 B2 | 6/2006 | Opsal et al. | 356/601 |
| 7,068,363 B2 | 6/2006 | Bevis et al. | 356/237.5 |
| 2004/0119970 A1 | 6/2004 | Dusa et al. | 356/237.1 |
| 2006/0033921 A1 | 2/2006 | Den Boef et al. | 356/446 |
| 2006/0066855 A1 | 3/2006 | Den Boef et al. | 356/401 |
| 2006/0126074 A1 | 6/2006 | Van Der Werf et al. | 356/489 |
| 2006/0139592 A1 | 6/2006 | Den Boef et al. | 355/53 |
| 2007/0279644 A1 | 12/2007 | Teun Plug et al. | |

FOREIGN PATENT DOCUMENTS

| | | |
|---|---|---|
| EP | 1 596 423 A1 | 11/2005 |
| KR | 2001-40094 A | 5/2001 |

* cited by examiner

METROLOGY TOOL, SYSTEM COMPRISING A LITHOGRAPHIC APPARATUS AND A METROLOGY TOOL, AND A METHOD FOR DETERMINING A PARAMETER OF A SUBSTRATE

This application is a continuation-in-part of co-pending U.S. patent application Ser. No. 11/443,452 filed May 31, 2006, the entire contents of which is hereby incorporated by reference.

FIELD

The present invention relates to a metrology tool for measuring a parameter of a substrate which substrate has been provided with a pattern in a lithographic apparatus, the parameter, for example, being an Overlay (Ovl) and/or Critical Dimensions (CD) and/or Film Thickness (FT) and/or Refractive Index (RI) of a layer and/or macro defects and/or micro defects. The invention also relates to a system comprising a lithographic apparatus and a metrology tool, as well as a method for determining the parameter of a substrate coming from a lithographic apparatus.

DESCRIPTION OF THE RELATED ART

A track is a machine that applies one or more photosensitive films onto a substrate (zero or more films may be anti-reflective coatings to improve imaging performance of the lithographic apparatus). The thickness and refractive index of each film may be critical and must therefore be controlled e.g. using FT and/or RI measurements.

This coated substrate can be measured using the metrology tool, data is processed and can be used for feedback or feed forward control of upstream and downstream process steps.

The coated substrate is now transported to the lithographic apparatus for exposure.

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the lithographic apparatus it is critical to accurately set the position of the substrate, in order to position different layers correctly on top of each other. This process is known as aligning. Accurate aligning is generally done by accurately determining the position of the substrate relative to a substrate table and determining the position of the substrate table with respect to the patterning device and projection beam. With this it is possible to use different alignment strategies. Choosing the optimal alignment strategy is important in obtaining optimal overlay. Different procedures for selecting an alignment strategy have been developed to comply with different applications. With this use is being made of an overlay indicator. See for further description of possible alignment strategies for instance U.S. Pat. No. 7,042,552, which is incorporated herein by reference.

Besides overlay the shape "Critical Dimensions" of the exposed structures (like lines and/or contact holes) is an important parameter to control.

After exposure the substrate is developed, the exposed or unexposed resist is removed (depending on positive or negative resist). The shape of the formed resist structures must be correct, in terms of OVL, CD, macro defects, micro defects, etc. This is checked using a metrology tool after the develop process.

The values of the overlay indicators can, for example, be calculated by measuring single batches of substrates on an overlay metrology tool. For this an offline overlay metrology tool is used in order to get high confidence values. Measuring of the substrates on the offline overlay metrology tool causes extra effort and time, particularly since the overlay metrology tool is relatively slow, due to low speed stages and because of high settling times.

Competing metrology tools have relatively high acquisition times such that lower move times do not impact throughput greatly. In case of a metrology tool with low acquisition times the movement time becomes the dominant throughput limiter. Fast stages with low (system) settling times become important.

A measurement (Move-Acquire-Measure) consists of:

move to a measurement site on the substrate—this site has special structures (including no structure at all for FT or structures in multiple process layers) to be sensitive for the effect(s) being investigated (like Ovl, CD, FT, RI, macro defects, micro defects etc.)

acquisition—illuminating the site with light of certain wavelength (and certain bandwidth), certain polarization mode and aperture settings. The reflected light is projected on a sensor.

measurement—the sensor data is processed using certain algorithms to yield information on the effects that must be reported (OVL, CD, FT, RI, macro defects, micro defects).

SUMMARY

It is desirable to provide a high speed metrology tool for measuring a parameter of a substrate, which substrate has been provided with a pattern in a lithographic apparatus.

According to an embodiment of the invention there is provided a metrology tool arranged to measure a parameter of a substrate which substrate has been provided with a pattern in a lithographic apparatus, the metrology tool comprising:

a base frame;

a substrate table constructed and arranged to hold the substrate;

a sensor constructed and arranged to measure a parameter of the substrate;

a displacement system configured to displace the substrate table or the sensor with respect to the other in a first direction;

a first balance mass; and a first bearing configured to movably support the first balance mass so as to be substantially free to translate in a direction opposite of the first direction in order to counteract a displacement of the substrate table or sensor in the first direction.

In another embodiment of the invention, there is provided a system comprising:
a lithographic apparatus comprising:
an illumination system configured to condition a radiation beam,
a support constructed to support a patterning device, the patterning device being capable of imparting the radiation beam with a pattern in its cross-section to form a patterned radiation beam,
a substrate table constructed to hold a substrate, and
a projection system configured to project the patterned radiation beam onto a target portion of the substrate;
a metrology tool according to claim 1; and
transfer mechanism configured to transferring substrates from the lithographic apparatus to the metrology tool.

According to a further embodiment of the invention, there is provided a method for determining a parameter of a substrate, the method comprising:
transferring a substrate having a pattern from a lithographic apparatus to a substrate table of a metrology tool; and
measuring a parameter of the substrate inside the metrology tool with a sensor, during which measuring, the substrate table or the sensor is displaced with respect to the other one in a first direction, which displacement is counteracted with a translation of a balance mass in an opposite direction.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
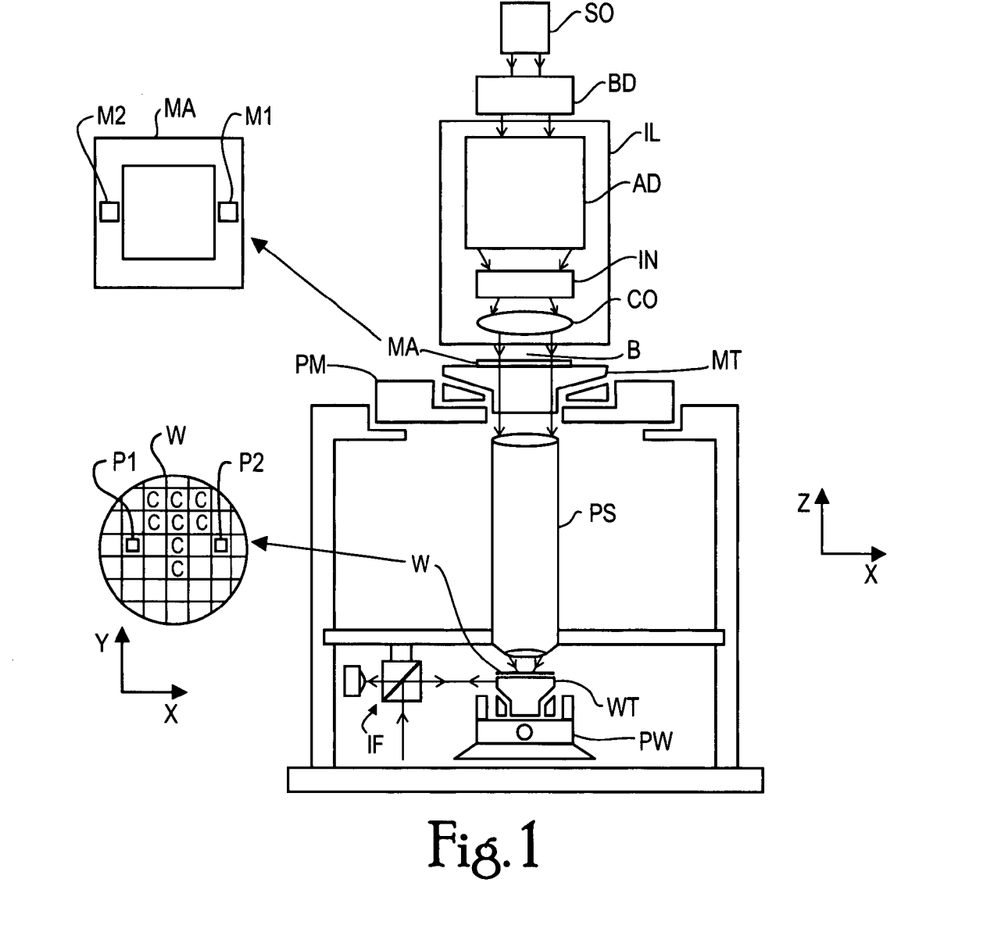
FIG. 1 depicts a lithographic apparatus according to the state of the art.

FIG. 1 schematically depicts a lithographic apparatus. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
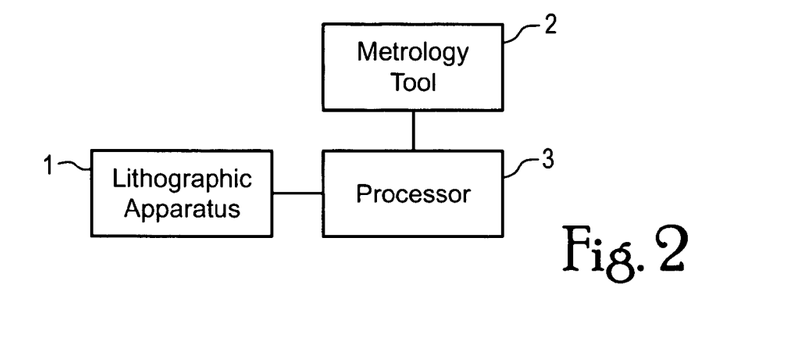
FIG. 2 depicts a system according to an aspect of the invention.

FIG. 2 shows an example of a system comprising a lithographic apparatus 1, a metrology tool 2 and a processor 3. The lithographic apparatus 1 may be constructed, for example, according to the embodiment shown in FIG. 1. The metrology tool 2 is arranged to measure a parameter of a substrate coming from the lithographic apparatus 1, e.g. overlay of patterns provided on substrates into the lithographic apparatus. Other parameters of interest of the substrate can be CD and/or FT and/or RI of a layer and/or macro defects and/or micro defects.

The processor 3 is constructed and arranged to receive parameter data from the metrology tool 2 and alignment data from the lithographic apparatus 1. The processor 3 may be part of the lithographic apparatus, but other configurations are possible. The parameter data may be received by the processor 3 directly from the metrology tool 2 or from an attached software application, loaded on another processor, not shown, or on the same processor 3. Preferably the system is arranged in a computer network such as to communicate with other apparatus and/or applications.

During manufacturing processes with the lithographic apparatus 1, substrates may be grouped in a box to form a particular batch. Substrates in such a batch stay together throughout the entire manufacturing process. The batches pass several manufacturing actions. The main manufacturing actions (but not limited to) which are of interest for this invention, are lithographic exposure actions in the lithographic apparatus 1 and an inspection action, e.g. an overlay inspection action, in the metrology tool 2 and etch.

The overlay data may, for example, be determined by measuring position errors for a plurality of overlay targets present on each of the selected substrates. This will result in so-called measured overlay data. Next, the overlay data may be processed.

Figure 3A:
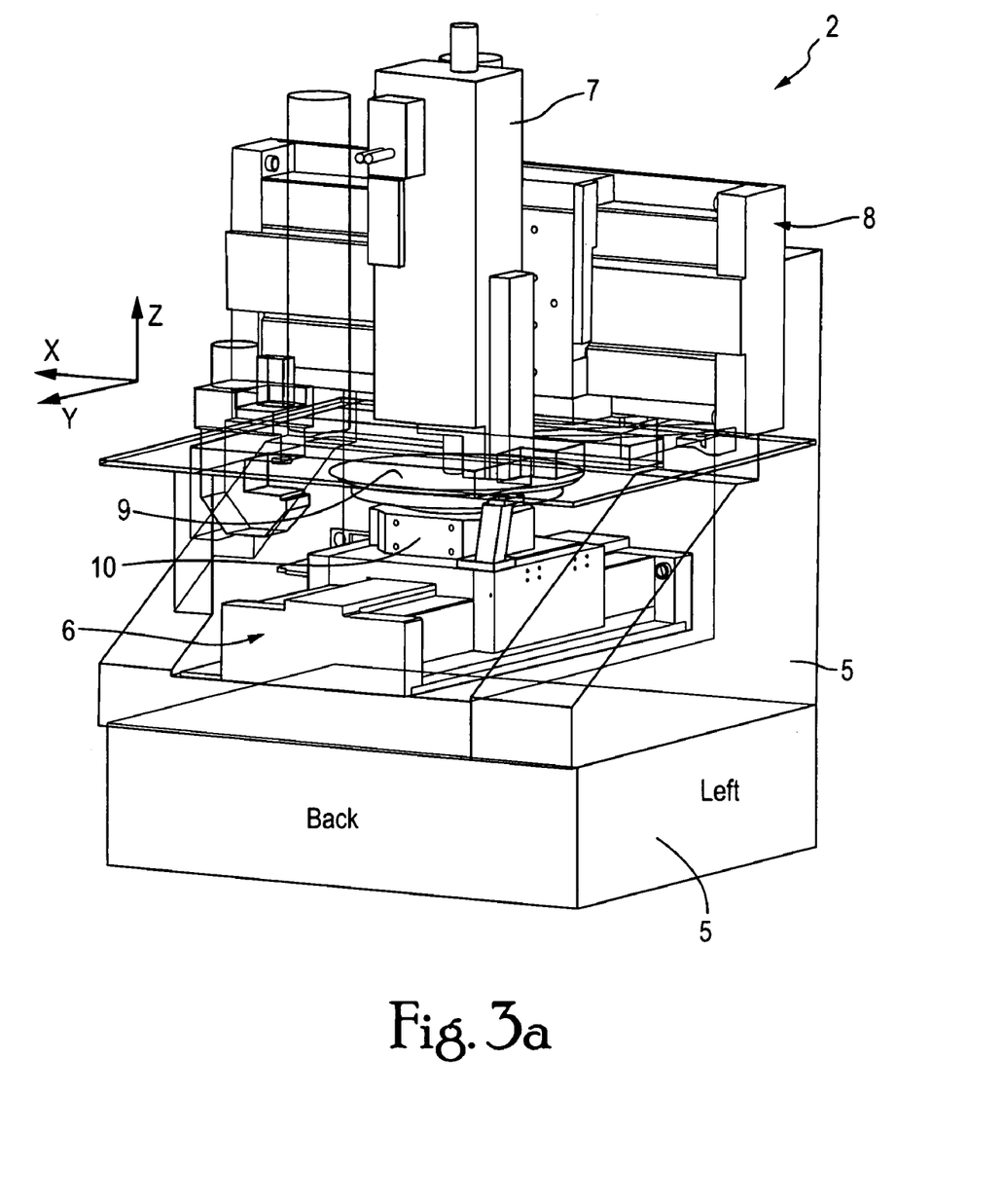
FIG. 3a depicts a metrology tool according to the state of the art.

FIG. 3 shows an embodiment according to the state of the art of the metrology tool 2. The metrology tool 2 comprises a base frame 5. With the base frame 5 a substrate stage 6 is movably connected in the Y-direction with respect to the base frame 5 by means of a first displacement system. Above the substrate stage 6 a sensor 7 is provided. The sensor 7 forms part of a sensor stage 8 which is movably connected in the X-direction with respect to the base frame 5 by means of a second displacement system. The substrate stage 6 is constructed to hold a substrate 9. For this, the substrate stage 6 comprises a substrate table 10. The substrate stage 6 is provided with a third displacement system to rotate the substrate table 10 around the Z-axis with respect to the substrate stage 6.

Thus the substrate 9 and the sensor 7 can be moved with respect to each other in several directions, which makes it possible to measure for example the entire overlay of patterns on the substrate 9 when held on the substrate table 10 of the substrate stage 6.

Figure 3B:
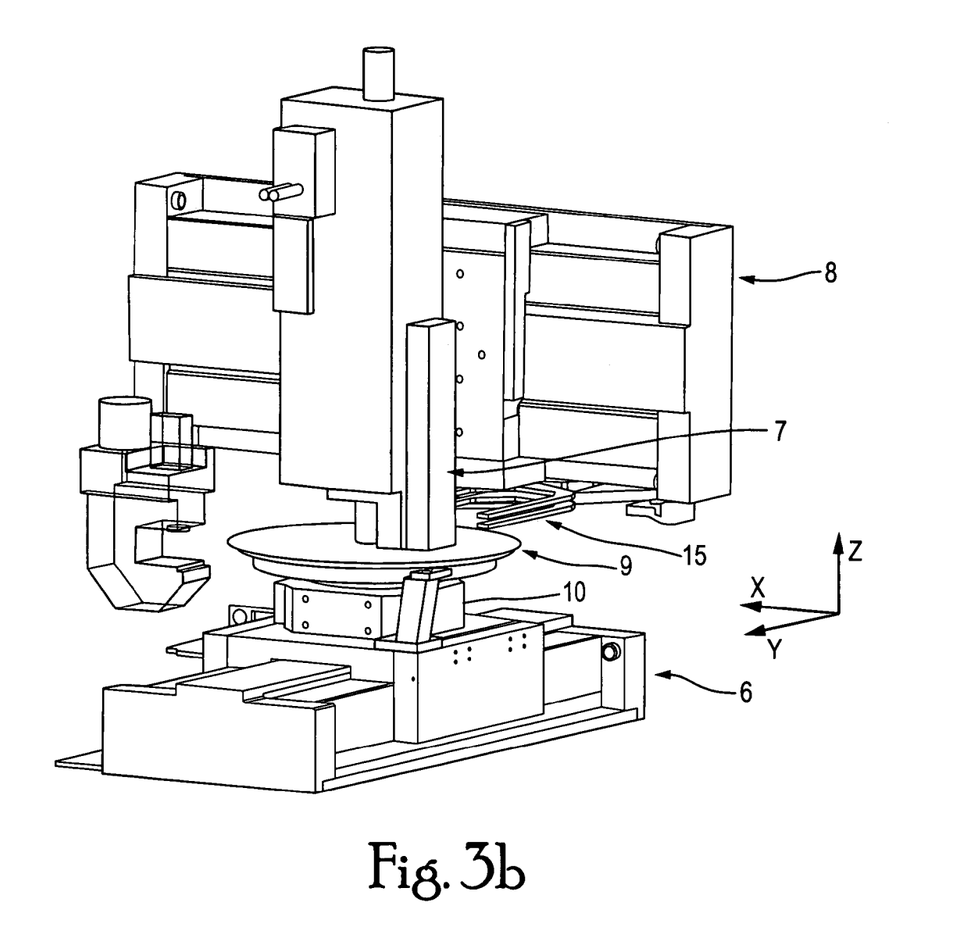
FIG. 3b depicts the metrology tool of FIG. 3a without the base frame.

Furthermore the metrology tool 2 comprises transfer means in the form of a substrate exchanger gripper 15, which can be seen in FIG. 3b.

In the metrology tool 2, reactions on the base frame 5, acceleration forces used to position the substrate table 10 and sensor 7 to sub-micrometer accuracy, are a major cause of vibrations. These vibrations impair the accuracy of the metrology tool 2. To minimize the effects of the vibrations, according to the state of the art the acceleration forces of the stages 6, 8 and/or table 10 are kept as low as possible, and/or the base frame 5 of the metrology tool 2 is kept isolated from the lithographic apparatus 1. Otherwise the vibrations coming from the metrology tool 2 would impair the accuracy of the lithographic process in the lithographic apparatus 1.

In order to be able to move the substrate stage 6 and/or substrate table 10 with the substrate 9 and the sensor stage 8 with the sensor 7 at higher speed with respect to each other, the present invention provides for the use of balance masses in the metrology tool (not shown in FIG. 3). Thus a first balance mass may be constructed and arranged to counteract displacements of the sensor stage 8 with the sensor 7 in the X-direction with respect to the base frame 5. In addition and/or as an alternative a second balance mass may be constructed and arranged to counteract displacements of the substrate stage 6 with the substrate table 10 and the substrate 9 in the Y-direction with respect to the base frame 5. In addition and/or as an alternative a third balance mass may be constructed and arranged to counteract displacements of the substrate table 10 and the substrate 9 around the Z-direction with respect to the substrate stage 6 and base frame 5.

As a non-limiting example, in FIGS. 4-7, embodiments are shown for providing a balance mass system for the movability of the substrate stage 6 with substrate table 10 and substrate 9 in the Y-direction. Similar systems may also be provided for counteracting displacements of the sensor stage 8 with sensor 7 and/or of the substrate table 10 with substrate 9 around the Z-direction.

Figure 4:
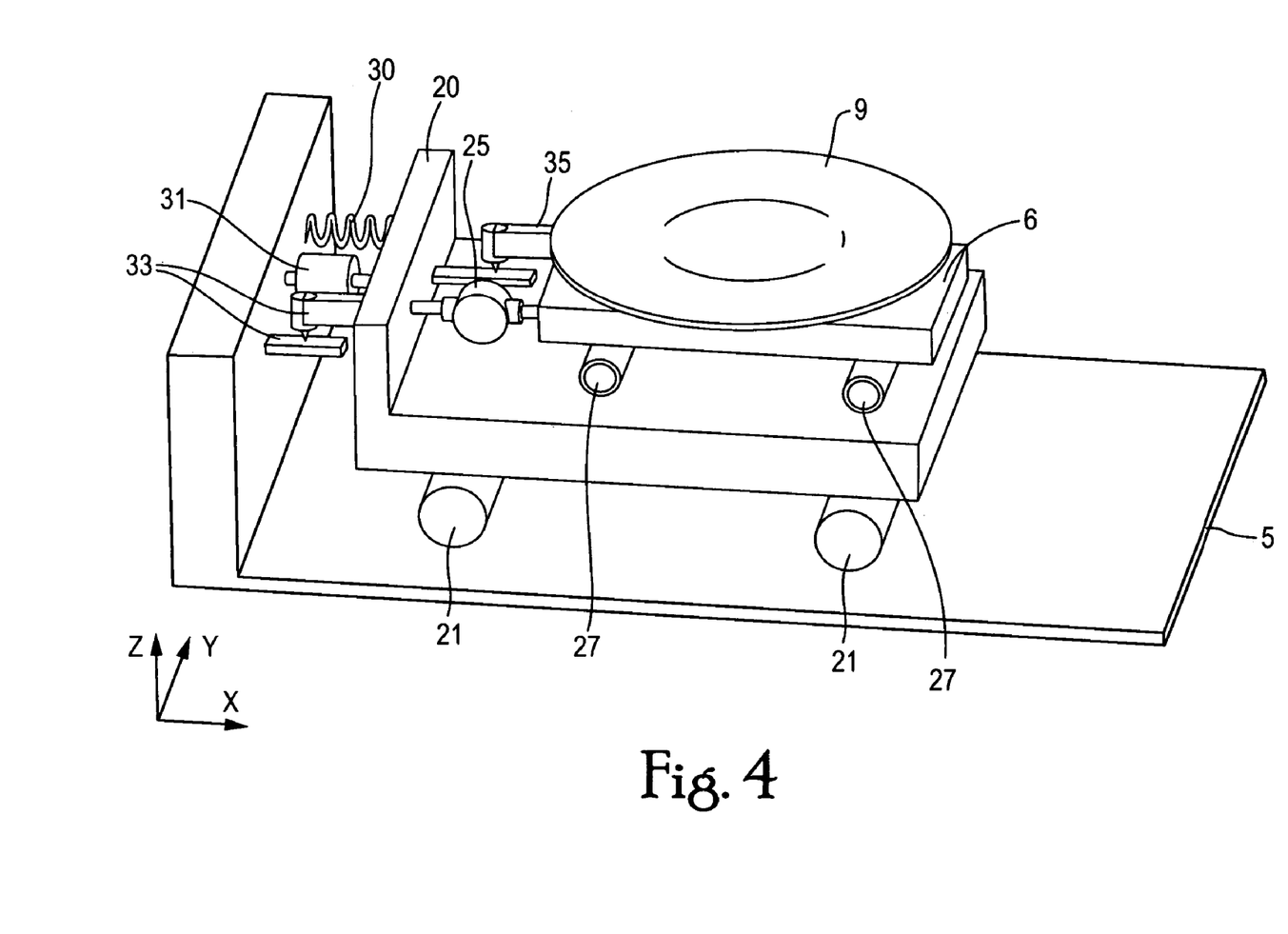
FIG. 4 depicts a part of the metrology tool of FIG. 3 showing an embodiment of a substrate table with passive balance mass system according to the invention.

In FIG. 4 a balance mass 20 is provided, which is placed on a bearing 21 (for example a roller bearing or gas bearing). The bearing 21 movably supports the balance mass 20 with respect to the base frame 5 so as to be substantially free to translate in a direction which is opposite to a displacement of the substrate stage 6 with substrate table 10 and substrate 9 in the Y-direction. The balance mass 20 is coupled to the substrate stage 6 by means of a substrate stage positioning actuator 25, for example a stepping motor or other steerable drive. The substrate stage 6 is placed on a bearing 27. The bearing 27 movably supports the substrate stage 6 with respect to the balance mass 20 so as to be substantially free to be displaced in the Y-direction by the actuator 25.

The balance mass 20 is coupled to the base frame 5 via an elastic coupling comprising a spring 30. Furthermore the balance mass 20 is coupled to the base frame 5 via a damper 31. The damper 31 is positioned in parallel with the spring 30.

Between the balance mass 20 and the base frame 5 a feed forward controller 33 is provided, which measures the position of the balance mass 20 with respect to the base frame 5. Such a feed forward controller is also provided between the substrate stage 6 and the balance mass 20, which feed forward controller is given the reference numeral 35.

If, during measurement of the overlay of the substrate 9, the substrate stage 6 is driven by the actuator 25, and thus displaced in the Y-direction, a reaction force is immediately set on the balance mass 20, causing the balance mass 20 to move in the opposite direction. The amount of displacement of the balance mass in the opposite direction depends on the mass ratio of the balance mass 20 with respect to the substrate stage 6 (including the substrate table 10, the substrate 9, etc.). With this the spring 30 and damper 31 are used to damp movement of the balance mass to avoid wind up, that is to say resonance of the balance mass. The provision of this balance mass system makes it possible to substantially enlarge the speed and acceleration forces of the substrate stage 6. The higher speed and higher acceleration forces may no longer lead to vibrations and/or other disturbing forces in the base frame 5 of the metrology tool 2. This in turn makes it possible position the metrology tool at any desired position with respect to the lithographic apparatus. For example the metrology tool with the balance mass system according to an embodiment of the present invention may now be placed even on top of an existing lithographic apparatus or at least connected therewith.

Figure 5:
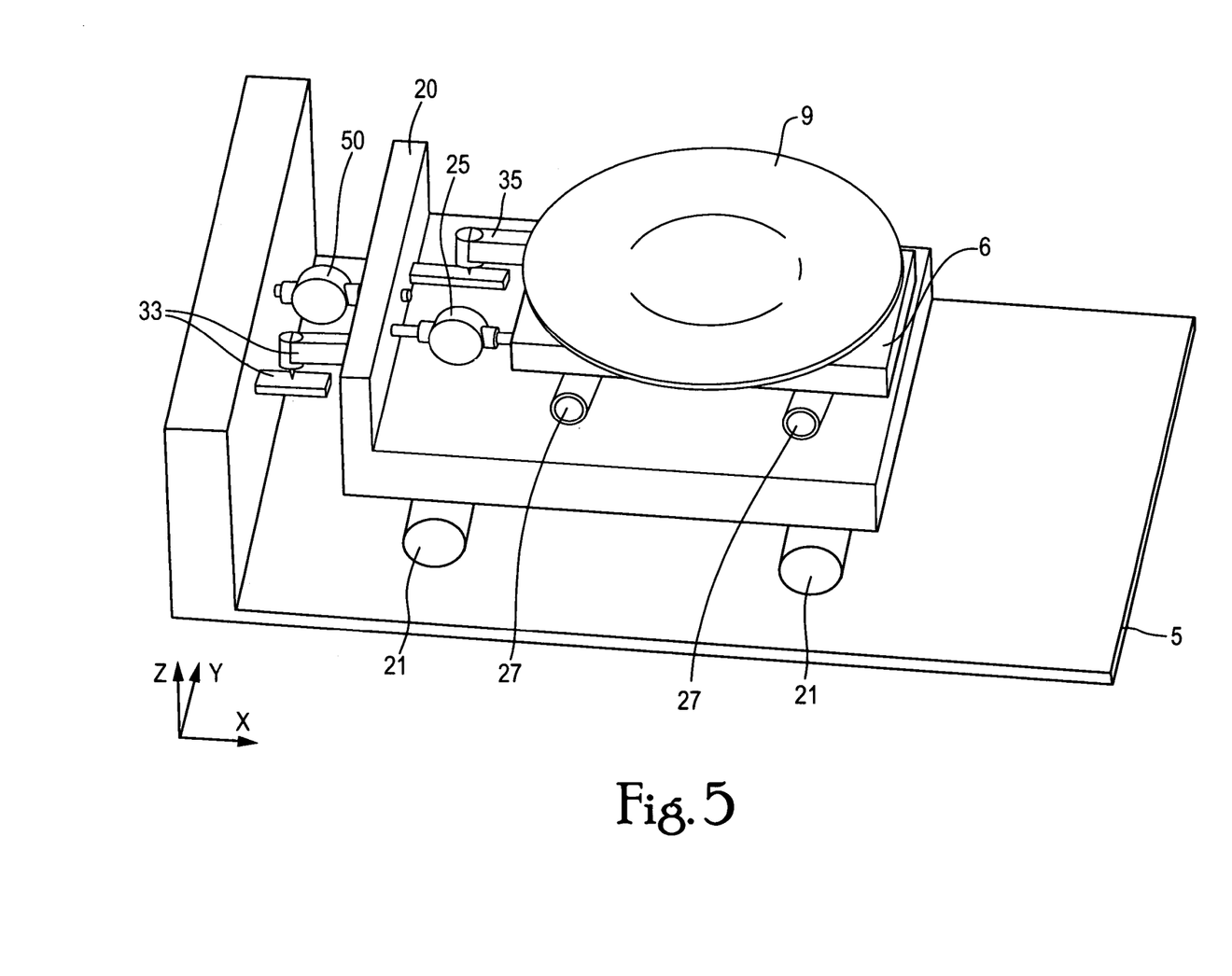
FIG. 5 depicts an embodiment corresponding to FIG. 4 with an active balance mass system according to the invention.

FIG. 5 shows a variant embodiment of FIG. 4 in which the spring-damper system between the balance mass 20 and the base frame 5 is replaced by a balance mass positioning actuator 50, for example a stepping motor or other steerable drive. If in this embodiment the substrate stage 6 is displaced in the Y-direction by proper steering of the substrate stage positioning actuator 25, this is immediately detected by the feed forward controller 35 which sends out a signal to the balance mass positioning actuator 50 in order to displace the balance mass 20 by a corresponding amount in the opposite direction. In order to be able to properly steer the substrate stage positioning actuator 25 and the balance mass positioning actuator 50, the feed forward controller 33 is used. The balance mass actuator 50 may also be used to correct the position of the balance mass 20 which can have a tendency to drift from a correct position. This drift can be the result of friction between the base frame 5 and the balance mass 20, for example.

In an embodiment the substrate stage 6 and the balance mass 20 may form an integrated linear motor in which, for example, the substrate stage is provided with stage carrying coils and acting as a rotor and the balance mass 20 is formed as a plate acting as a stator. Both rotor and stator are guided with respect to the base frame. In operation, if the rotor is accelerated to the left, the stator will move to the right due to reaction forces. The center of gravity of the rotor and stator together can thus remain at the same position.

Figure 6:
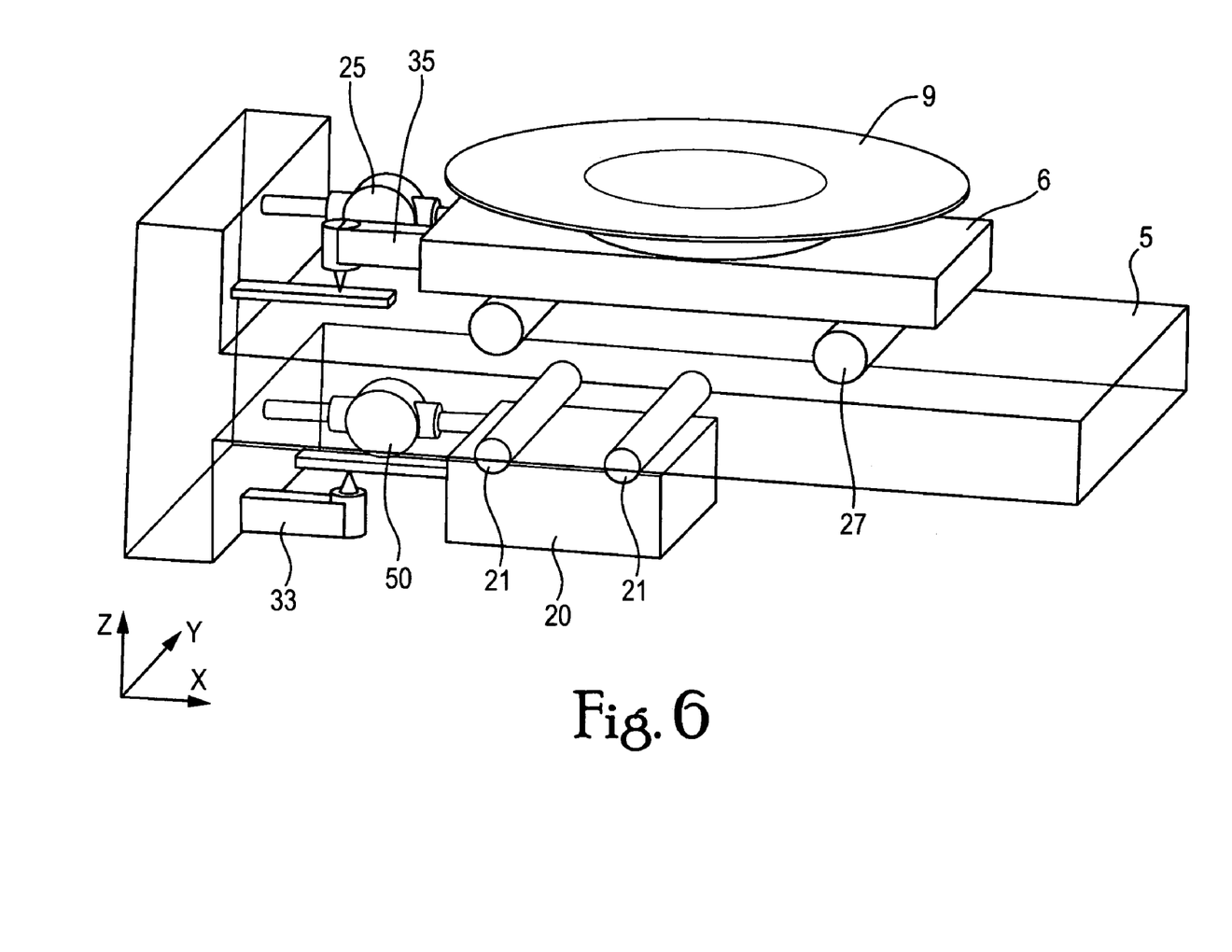
FIG. 6 depicts an embodiment corresponding to FIG. 5 with the balance mass system coupled indirectly to the substrate table.

FIG. 6 shows a variant embodiment of FIG. 5, in which the substrate stage 6 is supported with its bearing 27 directly on the base frame 5. The balance mass 20 itself is also supported with its bearing 21 directly on the base frame 5. The substrate stage 6 is now directly connected with its substrate stage positioning actuator 25 and its feed forward controller 35 to the base frame 5. The balance mass 20 is also directly connected with its balance mass positioning actuator 50 and its feed forward controller 33 to the base frame 5. During measurement of, for example, the overlay of the substrate 9, a displacement of the substrate stage 6 by means of the positioning actuator 25 is detected by the feed forward controller 35 which sends out a signal to the balance mass positioning actuator 50 in order to displace the balance mass 20 in the opposite direction by an appropriate amount.

Figure 7:
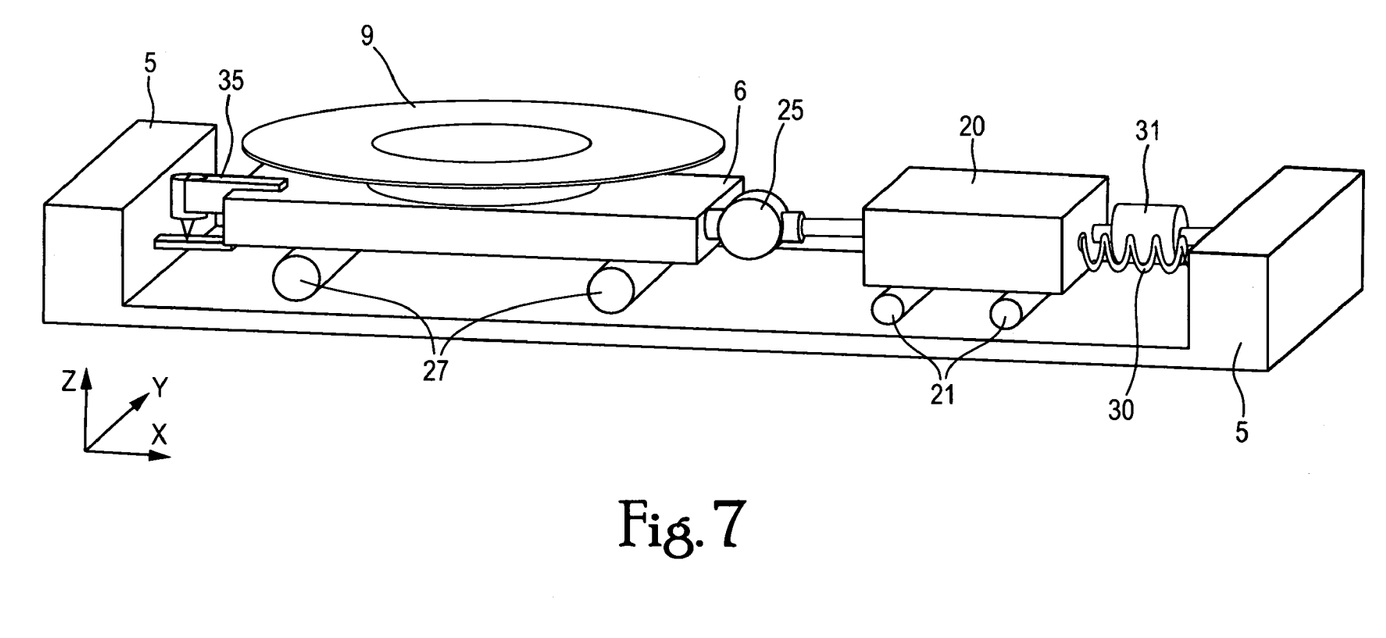
FIG. 7 shows an embodiment corresponding to FIG. 4 with a balance mass system in line with the substrate table.

FIG. 7 shows a variant embodiment of FIG. 4, in which the substrate stage 6 is supported with its bearing 27 directly on the base frame 5. The balance mass 20 itself is also supported with its bearing 21 directly on the base frame 5. The substrate stage 6 and the balance mass 20 are positioned in line with each other. The substrate stage 6 is now directly connected with its substrate stage positioning actuator 25 to the balance mass 20, and with its feed forward controller 35 to the base frame 5. The balance mass 20 is directly connected with its spring 30 and its damper 31 to the base frame 5.

Besides the embodiments shown, many variants are possible. For example, more than one sensor may be provided in the metrology tool. The sensor stage or the substrate stage of the metrology tool may also be moveably coupled with the base frame in both the X and Y-directions, while the other one of the sensor stage and the substrate stage is fixedly connected with the base frame. Important is that in the metrology tool the substrate and the one or more sensors are moveable with respect to each other which movements are counteracted with opposite movements of balance masses. In this manner each point of the substrate can be measured efficiently and without (causing) substantial vibrations. Another example of a metrology tool including a balance mass system, is that at least one of the stages is built as a stage carrying coils (rotor) to generate a varying magnetic field moving over a plate with static magnets (stator). The rotor is guided and can move with respect to the stator. The stator can move with respect to a guidance. It the rotor is accelerated to the left, the stator will move to the right due to the reaction forces. The center of gravity of the rotor and stator together can thus remain at the same position (neglecting friction forces, etc.). If the stage drifts away when multiple moves are performed, then in a variant embodiment it is also possible to use two weak springs mounted on either side (in the displacement direction) of the stator to the base frame as a balance mass compensator. Another embodiment of an active balance mass compensator is a controlled actuator with sufficient stroke. The balance mass is typically, but not necessarily, heavier than the one of the substrate stage or the sensor stage (including their payload) of which the displacement needs to be compensated. The metrology tool can be integrated into a lithographic system (like a track, scanner or etcher). It can also be mounted separately thereon, or be constructed and arranged as a stand-alone unit. Most likely the metrology tool is placed "in-line" with a lithographic apparatus. The metrology tool can also be integrated into an etcher. The etcher removes material, which is not protected by the (remaining) resist film. This process 'copies' the exposed features into the layer(s) of material below the resist film(s).

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCD's), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A metrology tool arranged to measure a parameter of a substrate which substrate has been provided with a pattern in a lithographic apparatus, the metrology tool comprising: a base frame;

a substrate table constructed and arranged to hold the substrate;

a sensor constructed and arranged to measure a parameter of the substrate;

a displacement system configured to displace the substrate table or the sensor with respect to the other in a first direction;

a first balance mass; and a first bearing configured to movably support the first balance mass so as to be substantially free to translate in a direction opposite of the first direction in order to counteract a displacement of the substrate table or sensor in the first direction.

2. A metrology tool according to claim 1, wherein the balance mass is coupled to the substrate table or sensor.

3. A metrology tool according to claim 2, wherein a positioning actuator couples the balance mass with the substrate table or sensor.

4. A metrology tool according to claim 1, further comprising a second bearing configured to movably support the substrate table or sensor so as to be substantially free to be displaced in the first direction by the displacement system.

5. A metrology tool according to claim 4, wherein the second bearing is provided between the balance mass and the substrate table or sensor.

6. A metrology tool according to claim 1, wherein the balance mass is coupled to the base frame via an elastic coupling.

7. A metrology tool according to claim 6, wherein the elastic coupling comprises a spring.

8. A metrology tool according to claim 1, wherein the balance mass is coupled to the base frame via a damper.

9. A metrology tool according to claim 1, wherein the balance mass is coupled to the base frame via a spring-damper system comprising an element having the characteristic of a spring connected in series with an element having the characteristic of a damper.

10. A metrology tool according to claim 1, wherein the balance mass is coupled to the base frame via an elastic coupling and a damper positioned in parallel with the elastic coupling.

11. A metrology tool according to claim 1, further comprising a feed forward controller constructed and arranged to measure the position of the substrate table or sensor with respect to the balance mass and/or base frame.

12. A metrology tool according to claim 1, further comprising a feed forward controller constructed and arranged to measure the position of the balance mass with respect to the base frame.

13. A metrology tool according to claim 1, further comprising a balance mass positioning actuator constructed and arranged to control the position of the balance mass.

14. A metrology tool according to claim 13, wherein the balance mass is coupled to the base frame via the balance mass positioning actuator.

15. A metrology tool according to claim 1, wherein the substrate table or sensor is coupled to the base frame via a positioning actuator and a feed forward controller, and wherein the balance mass is coupled to the base frame via a balance mass actuator and a feed forward controller.

16. A metrology tool according to claim 1, wherein the first bearing is provided between the balance mass and the base frame.

17. A metrology tool according to claim 1, wherein the balance mass is provided in line with the substrate table or sensor.

18. A metrology tool according to claim 1, wherein the displacement system is also constructed and arranged to displace the substrate table or sensor with respect to the other one in a second direction perpendicular to the first direction, and further comprising a second balance mass and a third bearing configured to movably support the second balance mass so as to be substantially free to translate in a direction opposite of the second direction in order to counteract a displacement of the substrate table or sensor in the second direction.

19. A metrology tool according to claim 1, wherein the displacement system is also constructed and arranged to displace the substrate table or sensor with respect to the other one in a third direction which is a rotational direction, and further comprising a third balance mass and a fourth bearing configured to movably support the third balance mass so as to be substantially free to translate in a direction opposite of the third direction in order to counteract a displacement of the substrate table or sensor in the third direction.

20. A metrology tool according to claim 1, wherein the substrate table or sensor and the balance mass are arranged and construed to form an integrated linear motor.

21. A system comprising:
 a lithographic apparatus comprising:
  an illumination system configured to condition a radiation beam,
  a support constructed to support a patterning device, the patterning device being capable of imparting the radiation beam with a pattern in its cross-section to form a patterned radiation beam,
  a substrate table constructed to hold a substrate, and
  a projection system configured to project the patterned radiation beam onto a target portion of the substrate;
 a metrology tool according to claim 1; and
 transfer mechanism configured to transferring substrates from the lithographic apparatus to the metrology tool.

22. A system according to claim 21, wherein the metrology tool is integrated in or connected with the lithographic apparatus.

23. A method for determining a parameter of a substrate, the method comprising: transferring a substrate having a pattern from a lithographic apparatus to a substrate table of a metrology tool; and
 measuring a parameter of the substrate inside the metrology tool with a sensor, during which measuring, the substrate table or the sensor is displaced with respect to the other one in a first direction, which displacement is counteracted with a translation of a balance mass in an opposite direction.

24. A method according to claim 23, wherein on displacement of the substrate table or sensor with respect to the other, the position of a combined center of gravity of the balance mass and the substrate table or sensor relative to a base frame remains substantially stationary.

25. A method according to claim 23, wherein the action point of an applied force driving the substrate table or sensor coincides with the combined center of gravity of the balance mass and the substrate table or sensor.

26. A method according to claim 23, wherein, in use, vibration of the balance mass due to an elastic coupling between the balance mass and a base frame is actively damped by a balance mass actuator.

* * * * *